(12) United States Patent
Chapman et al.

(10) Patent No.: US 6,661,814 B1
(45) Date of Patent: Dec. 9, 2003

(54) METHOD AND APPARATUS FOR SUPPRESSING STIMULATED BRILLOUIN SCATTERING IN FIBER LINKS

(75) Inventors: William B. Chapman, Sunnyvale, CA (US); Andrew Daiber, Palo Alto, CA (US); Hua Li, Fremont, CA (US); Mark McDonald, Milpitis, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/335,628

(22) Filed: Dec. 31, 2002

(51) Int. Cl.[7] .................................................. H01S 3/30
(52) U.S. Cl. .................. 372/6; 372/9; 372/28; 372/92; 385/15; 385/24; 385/39; 359/110
(58) Field of Search ............................ 372/6, 9, 92, 26, 372/28; 385/39, 15; 383/24; 359/110

(56) References Cited

U.S. PATENT DOCUMENTS 5,940,196 A * 8/1999 Piehler et al. ................. 398/91
6,542,683 B1 * 4/2003 Evans et al. ................. 385/127

2001/0004289 A1 * 6/2001 Lee et al. ..................... 359/110
2002/0081069 A1 * 6/2002 Yenjay et al. ................. 385/39

* cited by examiner

Primary Examiner—Leon Scott, Jr.
(74) Attorney, Agent, or Firm—Blakely, Sokoloff, Taylor & Zafman LLP (57) ABSTRACT

Method and apparatus for producing a laser output having stimulated Brillouin scattering (SBS) suppression characteristics. An excitation signal is provided to an optical path length adjustment element in an external cavity laser to modulate the optical path length of the cavity. This produces a laser output having a wavelength modulation frequency and line width that are a function of the frequency and amplitude of the excitation signal. Under appropriate modulation frequency and line width combinations, the laser output comprises an optical signal with SBS suppression characteristics, thus enabling a higher power signal to be launched into a fiber link since the SBS suppression characteristics raise the SBS threshold of the link. The optical path length modulation also produces an intensity (amplitude) modulation in the laser output. A detector is employed to produce a feedback signal indicative of the intensity modulation that is used for tuning the laser in accordance with a wavelength locking servo loop.

30 Claims, 7 Drawing Sheets

$$\text{Error} = \int_{t_1}^{t_2} ERe^{i\phi(\omega)}dt \cong \sum_{i=1}^{n} E_i R_i e^{i\phi(\omega)} \quad (5)$$

*Fig. 9*

METHOD AND APPARATUS FOR SUPPRESSING STIMULATED BRILLOUIN SCATTERING IN FIBER LINKS

FIELD OF THE INVENTION

The field of invention relates generally to optical communications and, more specifically but not exclusively relates to technique for modulating the cavity optical path length of an external cavity diode laser (ECDL) for suppression of Stimulated Brillouin scattering in fiber links into which the laser's output is launched.

BACKGROUND INFORMATION

There is an increasing demand for tunable lasers for test and measurement uses, wavelength characterization of optical components, fiberoptic networks and other applications. In dense wavelength division multiplexing (DWDM) fiberoptic systems, multiple separate data streams propagate concurrently in a single optical fiber, with each data stream created by the modulated output of a laser at a specific channel frequency or wavelength. Presently, channel separations of approximately 0.4 nanometers in wavelength, or about 50 GHz are achievable, which allows up to 128 channels to be carried by a single fiber within the bandwidth range of currently available fibers and fiber amplifiers. Greater bandwidth requirements will likely result in smaller channel separation in the future.

DWDM systems have largely been based on distributed feedback (DFB) lasers operating with a reference etalon associated in a feedback control loop, with the reference etalon defining the ITU wavelength grid. Statistical variation associated with the manufacture of individual DFB lasers results in a distribution of channel center wavelengths across the wavelength grid, and thus individual DFB transmitters are usable only for a single channel or a small number of adjacent channels.

Continuously tunable external cavity lasers have been developed to overcome the limitations of individual DFB devices. Various laser-tuning mechanisms have been developed to provide external cavity wavelength selection, such as mechanically tuned gratings used in transmission and reflection. External cavity lasers must be able to provide a stable, single mode output at selectable wavelengths while effectively suppress lasing associated with external cavity modes that are within the gain bandwidth of the cavity. These goals have been difficult to achieve, and there is accordingly a need for an external cavity laser that provides stable, single mode operation at selectable wavelengths.

Typically, optical signals are transmitted over a fiber optic based infrastructure comprising multiple fiber links. One problem that may occur when laser-based optical sources transmit optical signals over fiber relates to Brillouin scattering. Brillouin scattering is an inelastic process in which part of the power is lost from an optical wave and absorbed by the transmission medium. The remaining energy is then re-emitted as an acoustic wave of lower frequency. Brillouin scattering processes can become nonlinear in optical fibers due to the high optical intensity in the core and the long interaction lengths afforded by these waveguides. Stimulated Brillouin scattering (SBS) occur when the light launched into the fiber exceeds a threshold power level for the process. Under the conditions of stimulated scattering, optical power is more efficiently converted from the input pump wave to a scattered Stokes wave.

The scattered wave is frequency-shifted from the pump and in the case of SBS propagates in the opposite direction. This means that the amount of optical power leaving the far end of the fiber no longer increases linearly with the input power. The maximum launch power becomes clamped and the excess is simply reflected back out of the fiber. For long distance or highly-branched fiber links, it is important that as much power as possible can be launched into the fiber to compensate for attenuation and power splitting. Limits on the maximum output power due to SBS should therefore be avoided.

The foregoing stimulated Brillouin scattering problem is addressed in DBF lasers by using current control. However, this approach does not work for tunable external cavity lasers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION OF PREFERRED EMBODIMENTS

Embodiments of servo technique and apparatus for concurrently performing wavelength locking and SBS suppression in an external cavity diode laser (ECDL) described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
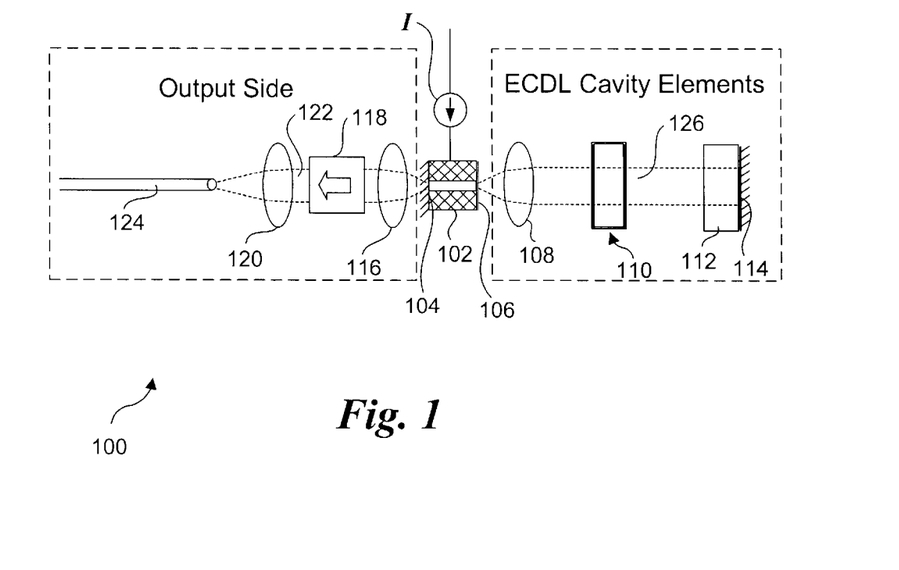
FIG. 1 is a schematic diagram of a generalized embodiment of an external cavity diode laser (ECDL)

As an overview, a generalized embodiment of an ECDL 100 that may be used to implement aspects of the invention described below is shown in FIG. 1. ECDL 100 includes a gain medium comprising a diode gain chip 102. Diode gain chip 102 comprises a Fabry-Perot diode laser including a partially-reflective front facet 104 and a non-reflective rear facet 106 coated with an anti-reflective (AR) coating to minimize reflections at its face. Diode gain chip 102 may comprise a bent-waveguide structure on the gain medium to realize the non-reflective rear facet 106. The external cavity elements include a diode intracavity collimating lens 108, tuning filter elements 110, a cavity-length modulating element 112, and a reflective element 114. In general, reflective element 114 may comprise a mirror, grating, prism, or other reflector or retroreflector which may also provide the tuning filter function in place of element 110. The output side components include a diode output collimating lens 116, an optical isolator 118, and a fiber focusing lens 120, which focuses an output optical beam 122 such that it is launched into a polarization-preserving fiber 124.

The basic operation of ECDL 100 is a follows. A controllable current I is supplied to diode gain chip 102 (the gain medium), resulting in a voltage differential across the diode junction, which produces an emission of optical energy (photons). The emitted photons pass back and forth between partially-reflective front facet 104 and reflective element 114, which collectively define the ends of an external laser cavity. As the photons pass back and forth, a plurality of resonances, or "lasing" modes are produced. Under a lasing mode, a portion of the optical energy (photons) temporarily occupies the external laser cavity, as depicted by intracavity optical beam 126; at the same time, a portion of the photons in the external laser cavity eventually passes through partially-reflective facet 104, thereby producing the laser's output beam 122. Through appropriate modulation of the input current (generally for communication rates of up to 2.5 GHz) or through modulation of an external element disposed in the optical path of the output beam (not shown) (for 10 GHz and 40 GHz communication rates), data can be modulated on the output beam to produce an optical data signal. Such a signal may launched into a fiber and transmitted over a fiber-based network in accordance with practices well known in the optical communication arts, thereby providing very high bandwidth communication capabilities.

Light comprising the photons that exit the laser cavity through partially-reflective front facet 104 passes through diode output collimating lens 116, which collimates the light into output beam 122. The output beam then passes through optical isolator 118. The optical isolator is employed to prevent back-reflected light from being passed back into the external laser cavity, and is generally an optional element. After the light beam passes through the optical isolator, it is launched into the output fiber 124 by fiber focusing lens 120. Output fiber 124 may be either a polarization-preserving type or a single-mode type such as SMF-28.

The lasing mode of an ECDL is a function of the total optical path length between the cavity ends (the cavity optical path length); that is, the optical path length encountered as the light passes through the various optical elements and spaces between those elements and the cavity ends defined by partially-reflective front facet 104 and reflective element 114. This includes diode gain chip 102, diode intracavity collimating lens 108, tuning filter elements 110, and cavity-length modulating element 112, plus the path lengths between the optical elements (i.e., the path length of the transmission medium occupying the ECDL cavity, which is typically a gas such as air). More precisely, the total optical path length is the sum of the path lengths through each optical element and the transmission medium times the coefficient of refraction for that element or medium.

As discussed above, under a lasing mode, photons pass back and forth between the cavity end reflectors at a resonance frequency, which is a function of the cavity optical path length. In fact, without the tuning filter elements, the laser would resonate at multiple frequencies. For simplicity, if we model the external laser as a Fabry-Perot cavity, these frequencies can be determined from the following equation:

$$Cl = \frac{\lambda x}{2n} \quad (1)$$

where $\lambda$=wavelength, Cl=Length of the cavity, x=an arbitrary integer—1, 2, 3, . . . , and n=refractive index of the medium. The number of resonant frequencies is determined from the width of the gain spectrum. Furthermore, the gain spectrum is generally shaped as a parabola with a central peak—thus, the intensity of the lasing modes on the sides of the center wavelength (commonly called the side modes) rapidly drops off.

In accordance with aspects of the invention, techniques as disclosed herein for suppressing the stimulated Brillouin Scattering effect. SBS is a scattering of light backwards towards the transmitter caused by mechanical (acoustic) vibrations in the transmission medium (fiber). Although generally trivial in most cases, SBS can be very important in situations where a high quality, narrow linewidth laser is used at a relatively high power level.

SBS is caused by the presence of the optical signal itself. Even though a signal level of a few milliwatts seems very small, in the tiny cross-section of a single-mode fiber core the field can be very intense. An optical signal is in reality a very strong electromagnetic field. This field causes mechanical vibrations in the fibre which produce a regularly varying pattern of very slight differences in the refractive index. The Brillouin scattering effect is caused by light being reflected by the diffraction grating created by the regular pattern of RI changes.

At a more fundamental level, Brillouin scattering is understood as a scattering of a photon to a lower energy photon such that the energy difference appears in the form of a phonon. The effect is similar to Raman scattering, except that optical phonons participate in Raman scattering, whereas acoustic phonons participate in Brillouin scattering. This scattering effect results in a lost of power at the incident frequency and constitutes a loss mechanism for optical fibers.

At high power levels the nonlinear phenomena of SBS can lead to considerable fiber loss. The intensity of the scattered light grows exponentially once the incident power exceeds a threshold value. The threshold power level for SBS can be estimated by considering how the scattered-light intensity grows with noise. The SBS threshold power $P_{th}$, defined as the incident power at which half of the power is lost to SBS at the output end of a fiber of length L, can be estimated by the following equations:

$$g_B P_{th} L_{eff} / A_{eff} \approx 21, \quad (2)$$

where $g_B$ is the Brillouin gain coefficient, $A_{eff}$ is the effective mode cross section, often referred to as the effective core area, and $L_{eff}$ is the effective interaction length, defined by $$L_{eff} = [1 - \exp(-\alpha L)] / \alpha. \quad (3)$$

For optical communication systems, the fiber is sufficiently long that Leff can be approximated as $1/\alpha$. If we replace $A_{eff}$ by $\pi\omega^2$, where $\omega$ is the spot size, we get:

$$P_{th} \approx 21\alpha(\pi\omega^2)/g_B. \quad (4)$$

For silica fibers, $g_B \approx 5 \times 10^{-11}$ m/W. As a result, $P_{th}$ can be as low as ~ 1mW, especially near 1.55 μm, where the fiber loss is minimum. Clearly, SBS can limit the launched power considerably because of its low threshold.

The foregoing estimate of $P_{th}$ neglects the effect of spectral width associated with the incident light. Since the Brillouin-gain spectrum for silica fibers is quite narrow (<100 MHz), the threshold power can be increased to 10 mW or more by intentionally increasing the gain bandwidth (i.e., broadening the optical signal line width) to, e.g., 200–500 MHz through phase modulation.

Figure 2:
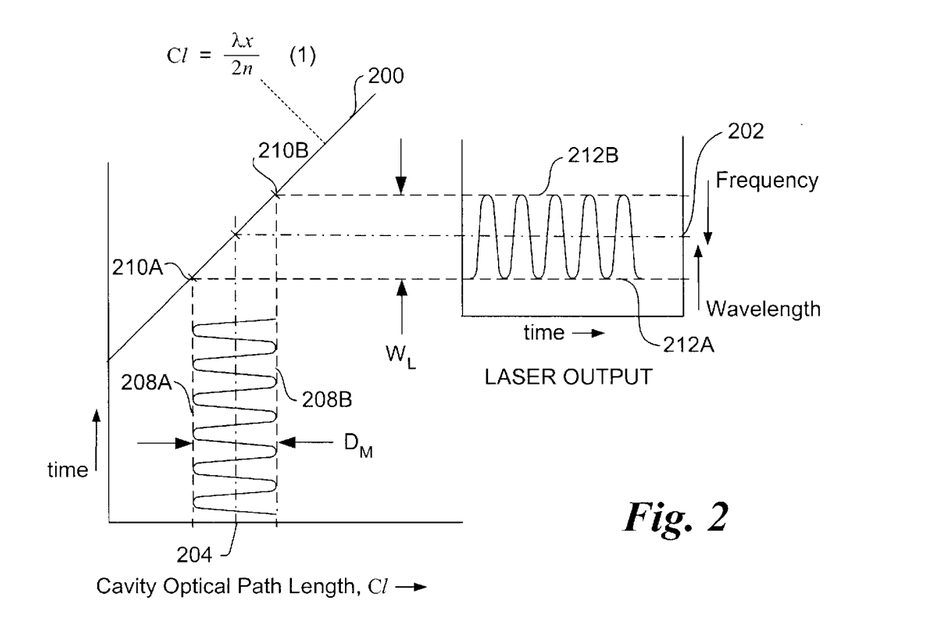
FIG. 2 is a diagram illustrating the effect modulating the optical path length of a laser cavity has on the line width of the laser's output.

In accordance with aspects of the invention, the line width of an optical signal produced by an ECDL is broadened by modulating the optical path length of the laser cavity so as to produce a wavelength-modulated output with a frequency excursion of sufficient bandwidth to suppress the undesired SBS effect. For example, FIG. 2 shows a diagram that relates optical path length to lasing mode wavelength, which of course is inversely related to the lasing mode frequency. As discussed above, if we model the external cavity as a Fabry-Perot cavity, the lasing modes will be a direct function of the optical path length of the cavity in accordance with equation (1). This relationship is depicted by line 200. Thus, if the cavity optical path length is modulated, a corresponding wavelength (and thus frequency) modulation will occur in the laser output depicted at the right side of the diagram. Furthermore, the center frequency 202 of the laser output will be directly dependent on the average or "substantially continuous" cavity optical path length 204 (and as a function of the center lasing mode defined by the tuning filters).

The slope of line 200 will generally be dependant on the nominal cavity optical path length and the scaling of the Cavity Optical Path Length and frequency axes. Accordingly, to establish a laser output line width $W_L$ having a sufficient frequency/wavelength excursion for SBS suppression, such as 200–500 MHz, a corresponding modulation of the cavity optical path length having a distance $D_M$ will be required, as depicted by cavity optical path length modulation limits 208A and 208B, intersection points 210A and 210B, and frequency/wavelength modulation limits 212A and 212B.

As describe below in further detail, various techniques may be applied to "tune" the laser to produce an optical output signal at a frequency corresponding to a desired communication channel. For example, this may be accomplished by adjusting one or more tuning elements, such as tuning filter elements 110, to produce a corresponding change in the cavity optical path length, thus changing the lasing mode frequency. The tuning filter elements attenuate the unwanted lasing modes such that the output beam comprises substantially coherent light having a narrow bandwidth.

Ideally, it is desired to maximize the power of the output beam over a frequency range corresponding to the various channel frequencies the ECDL is designed for. While an obvious solution might be to simply provide more drive current, this, by itself, doesn't work because a change in the drive current changes the optical characteristics (e.g., optical path length) of the diode gain chip. Furthermore, many diode gain chips only operate over a limited range of input current.

One technique for producing a maximal power output is to perform "wavelength locking" through phase control modulation. Under this technique, a "dither" or modulation signal is supplied to cause a corresponding modulation in the optical path length of the external laser cavity. This produces a modulated phase-shift effect, resulting in a small frequency modulation of the lasing mode. The result of this frequency modulation produces a corresponding modulation of the intensity (power) of the output beam, also referred to as amplitude modulation. This amplitude modulation can be detected using various techniques. In one embodiment, the laser diode junction voltage (the voltage differential across laser diode chip 102) is monitored while supplying a constant current to the laser diode, wherein the voltage is inversely proportional to the intensity of the output beam, e.g., a minimum measured diode junction voltage corresponds to a maximum output intensity. In another embodiment, a beam splitter is employed to split off a portion of the output beam such that the intensity of the split-off portion can be measured by a photo-electric device, such as a photodiode. The intensity measured by the photodiode is proportional to the intensity of the output beam. The measured amplitude modulation may then be used to generate an error signal that is fed back into a servo control loop to adjust the (substantially) continuous optical path length of the laser so as to produce maximal intensity.

Figure 3:
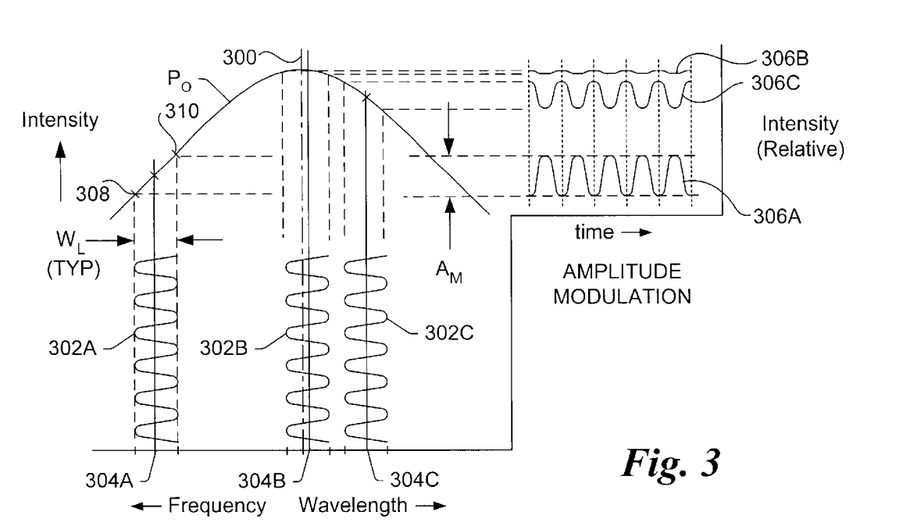
FIG. 3 is a diagram illustrating the effect modulating the optical path length of the laser cavity has on the frequency of the lasing mode and the modulation of the laser's output intensity.

The foregoing scheme is schematically illustrated in FIG. 3. The diagram shows a power output curve $P_O$ that is illustrative of a typical power output curve that results when the lasing mode is close to a desired channel, which is indicated by a channel frequency centerline 300. The objective of a servo loop that employs the phase-shift modulation scheme is to adjust one or more optical elements in the laser cavity such that lasing frequency is shifted toward the desired channel frequency. This is achieved through use of a demodulated error signal that results from frequency modulation of the lasing mode. Under the technique, a modulation signal is supplied to an optical element in the cavity, such as optical length modulation element 112, to modulate the optical path length of the cavity. This modulation is relatively small compared to the channel spacing for the laser.

Modulated signals 302A, 302B, and 302C respectively correspond to (average) laser frequencies 304A, 304B, and 304C. Laser frequency 304A is less than the desired channel frequency, laser frequency 304C is higher than the desired channel frequency, while 304B is near the desired channel frequency. Each modulated signal produces a modulation in the intensity of the output beam; these intensity modulations are respectively shown as modulated amplitude waveforms 306A, 306B, and 306C. Generally, these latter signals can be measured in the manners discussed above for determining the intensity of the output beam.

As depicted in FIG. 3, the peak-to-valley amplitude $A_M$ of waveforms 306A, 306B, and 306C is directly tied to the points in which the modulation limits for their corresponding wavelength modulated signals 302A, 302B, and 302C intersect with power output curve $P_O$, such as depicted by intersection points 308 and 310 for modulated signal 302A. Thus, as the laser frequency gets closer to the desired channel frequency, the peak to valley amplitude of the measured intensity of the output beam decreases. At the point where the laser frequency and the channel frequency coincide, this value becomes minimized.

Figure 4:
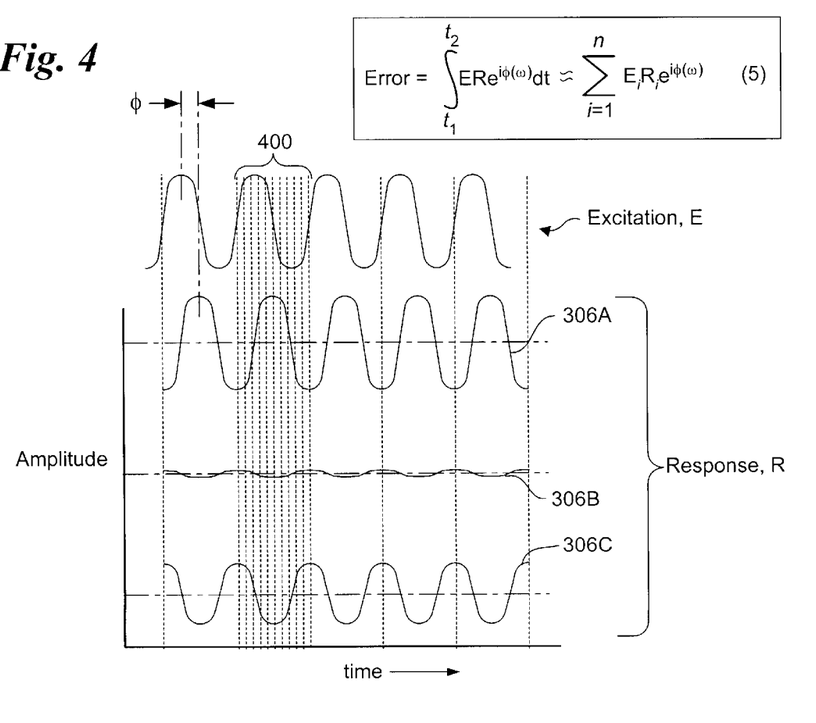
FIG. 4 is a diagram illustrating how a modulated excitation input signal and a resulting response output signal can be combined to calculate a demodulated error signal.

Furthermore, as shown in FIG. 4, the error may be derived from:

$$\text{Error} = \int_{t_1}^{t_2} ERe^{i\phi(\omega)} dt \approx \sum_{i=1}^{n} E_i R_i e^{i\phi(\omega)} \quad (5)$$

wherein the non-italicized i is the imaginary number, $\phi$ represents the phase difference between the excitation input (i.e., modulated signals 302A, 302B, and 302C) and the response output comprising the amplitude modulated output waveforms 306A, 306B, and 306C, and $\omega$ is the frequency of modulation. The integral solution can be accurately approximated by a discreet time sampling scheme typical of digital servo loops of the type described below, as depicted by time sample marks 400.

In addition to providing an error amplitude, the foregoing scheme also provides an error direction. For example, when the laser frequency is in error on one side of the desired channel frequency (lower in the illustrated example), the excitation and response waveforms will be substantially in phase. This will produce a positive aggregated error value. In contrast, when the laser frequency is on the other side of the desired channel frequency (higher in the example), the excitation and response waveforms are substantially out of phase. As a result, the aggregated error value will be negative.

Generally, the wavelength locking frequency of modulation $\omega$ should be selected to be several orders of magnitude below the laser frequency. For example, modulation frequencies within the range of 5 KHz–100 kHz may be used in one embodiment with a laser frequency of 185–199 THz. In accordance with other aspects of the invention, the selected wavelength locking modulation frequency and corresponding frequency excursion is selected so as to simultaneously perform both a wavelength locking function and an SBS suppression function. Under this technique, a phase modulation excitation signal is employed at a frequency proximate to the frequency desired to minimize the backscattered wave caused by SBS effects. Furthermore, the drive amplitude of the phase modulation excitation signal is selected to produce a frequency excursion of about 200–500 MHz in the laser output. Generally, combinations of frequency excursion (optical signal line width) and wavelength modulation frequencies within the foregoing ranges may be achieve a significant level of SBS suppression. Typically, the appropriate combination of signal line width and modulation frequency will be dependent on various fiber considerations, such as link distance, fiber diameter, etc. Accordingly, embodiments of the invention described below provide input controls to enable these SBS suppression modulation parameters to be adjusted.

The teachings and principles of the invention disclosed herein may be implemented in ECDL lasers having a general configuration similar to that discussed above with reference to ECDL 100. For example, with reference to FIG. 5, an ECDL 500 in shown including various elements common to ECDL 100 having like reference numbers, such as a gain diode chip 102, lenses 108, 116, and 120, etc. ECDL 500 further includes a cavity optical path length modulating element 512 having a reflective rear face 514. More specifically, the cavity optical path length modulating element comprises a Lithium Niobate ($LiNbO_3$) phase modulator to which a back-side mirror is coupled. Optionally, a reflective material may be coated onto the backside of the phase modulator. Lithium Niobate is a material that changes its index of refraction (ratio of the speed of light through the material divided by the speed of light through a vacuum) when a voltage is applied across it. As a result, by providing a modulated voltage signal across the $LiNbO_3$ phase modulator, the optical path length of the external laser cavity can be caused to modulate, thereby producing frequency modulated signals such as signals 302A, 302B, and 302C discussed above.

Figure 5:
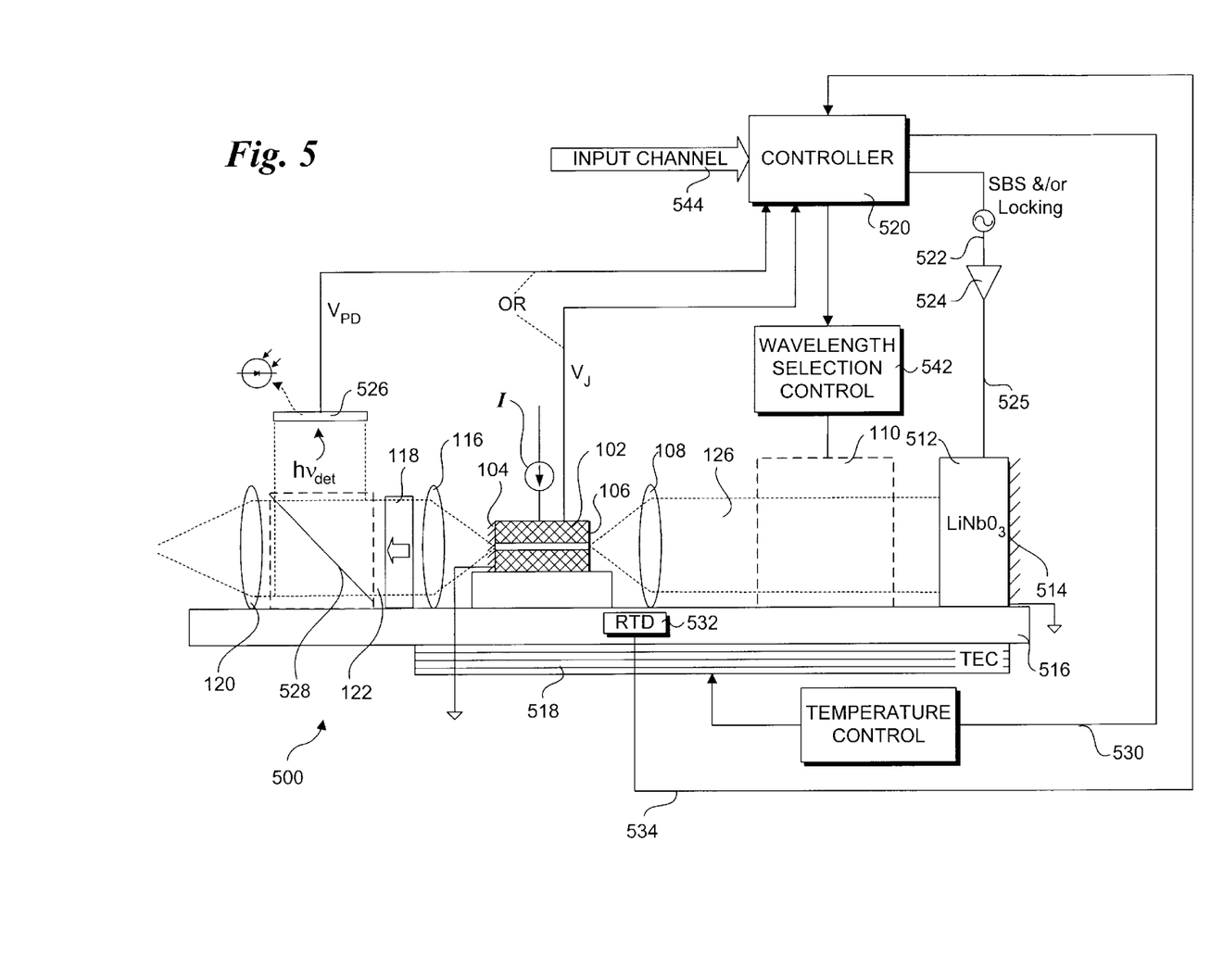
FIG. 5 is a schematic diagram of an ECDL in accordance with an embodiment of the invention in which a Lithium Niobate block is employed as an optical path length adjustment element that is driven by an excitation signal to induce an optical path length modulation that produces a laser output with good stimulated Brillouin scattering (SBS) suppression characteristics.

The various optical components of the ECDL 500 are mounted or otherwise coupled to a thermally-controllable base or "sled" 516. In one embodiment, one or more thermal-electric cooler (TEC) elements 518, such as a Peltier element, are mounted on or integrated in sled 516 such that the temperature of the sled can be precisely controlled via an input electrical signal. Due to the expansion and contraction of a material in response to a temperature change, the length of the sled can be adjusted very finely. Adjustment of the length results in a change in the distance between partially reflective front facet 104 and reflective element 514, which produces a change in the optical path length of the laser cavity. As a result, controlling the temperature of the sled can be used to adjust the frequency of the lasing mode. In general, temperature control of the sled will be used for very fine tuning adjustments, while coarser tuning adjustments will be made by means of tuning filter elements 110, as described in further detail below.

For completeness, let us first consider the operation of a modulated excitation signal that is used for both SBS suppression and wavelength locking feature. A controller 520 generates a modulated signal 522, which is amplified by an amplifier 524 to produce a modulated excitation signal 525. As described below, in one embodiment user input controls are provided to enable the frequency and amplitude of the modulated excitation signal to be individually controlled. The modulated excitation signal 525 is then supplied to a surface of the $LiNbO_3$ phase modulator, while an opposite surface of the phase modulator is connected to ground, thereby providing a voltage differential across the $LiNbO_3$ material. As a result, the optical path length of the modulator, and thus the entire laser cavity, is modulated at the modulation frequency (e.g. 5–100 KHz). Furthermore, the modulation of the laser cavity optical path length produced a frequency excursion in the laser output that is a function of the relative change in the optical path length (when compared with the overall "continuous" optical path length), which in turn is a function of the amplitude of the excitation signal 525 used to drive the phase modulator. In one embodiment, a 200 volt amplitude (i.e., peak-to-value voltage differential in the sinusoid waveform) results in a frequency excursion of approximately 400 MHz.

In addition to the frequency excursion, which coincides with a wavelength modulation of the laser output, the optical path length modulation produces a modulation in the intensity of output beam 122. In accordance with the principles discussed above with reference to FIGS. 3 and 4, this intensity (amplitude) modulation is indicative of the where current center frequency of the laser output intersects the power output curve $P_O$. Furthermore, this information can be used to derive an error signal that is used to tune the laser such that its center frequency substantially coincides with the desired channel frequency.

In the illustrated embodiment of FIG. 5 a photodetector 526 is used to detect the intensity of the laser output. A beam splitter 528 is disposed in the optical path of output beam 122, causing a portion of the output beam light to be redirected toward photodetector 526. In one embodiment, photodetector 526 comprises a photo diode, which generates a voltage charge in response to the light intensity it receives ($hv_{det}$). A corresponding voltage $V_{PD}$ is then fed back to controller 520.

Controller 520 includes a digital servo loop (e.g., phase lock loop) that is configured to adjust the temperature of sled 516 such that the amplitude modulation of the light intensity detected at photodectector 526 is minimized, in accordance with the frequency modulation scheme discussed above with reference to FIGS. 3 and 4. In an optional embodiment, the junction voltage across gain diode chip ($V_J$) is employed as the intensity feedback signal, rather than $V_{PD}$. An error signal is then derived by based on the amplitude modulation and phase of $V_{PD}$ or $V_J$ in combination with modulated signal 522. In response to the error signal, an appropriate adjustment in temperature control signal 530 is generated. Adjustment of the sled temperature causes a corresponding change in the overall (continuous) cavity length, and thus the lasing frequency. This in turn results in (ideally) a decrease in the difference between the lasing frequency and the desired channel frequency, thus completing the control loop. To reach an initial condition, or for a second feedback signal, a resistive thermal device (RDT) 532, such as a thermister or thermocouple, may be used to provide a temperature feedback signal 534 to controller 520.

As discussed above, if the excitation signal produces a sufficient frequency excursion, the corresponding line width of the laser output may be widened to the point when SBS suppression is achieved. Of course, the modulation frequency of the output wavelength modulation also needs to be selected and/or controlled to enable an adequate level of SBS suppression. Generally, the specific modulation frequency and output wavelength modulation amplitude will correspond to characteristics of the particular optical link/ network in which the laser output is optically coupled. Accordingly, embodiments of the invention may employ modulation frequency and modulation amplitude input control to enable users, such as test personnel, to "tune" the excitation signal to provide improved SBS suppression.

In addition to wavelength locking and SBS suppression, ECDL 500 also provides channel-tuning features. As illustrated, controller 520, in combination with a wavelength selection control block 542 and tuning filter elements 110, is used to switch the lasing frequency to correspond to a desired communication channel. For example, in response to an input channel command 544, controller 520 sends a corresponding frequency command signal to wavelength selection control block 542, which then provides a control input to tuning filter elements 110 to cause the lasing mode to be switched proximate to the desired input channel frequency. A continuous fine tuning adjustment is then made by means of the wavelength locking servo loop.

In general, various tuning filter elements and corresponding tuning adjustment techniques may be employed for channel selection purposes. For example, in an ECDL 600 shown in FIG. 6, tuning filter elements 110 comprise first and second tunable filters $F_1$ and $F_2$. In one embodiment, filters $F_1$ and $F_2$ comprise respective etalons, either made of a solid material or being gas filled. In one embodiment, filter tuning is effectuated by changing the optical path length of each etalon. This in turn may be induced by changing the temperature of the etalons.

Figure 6:
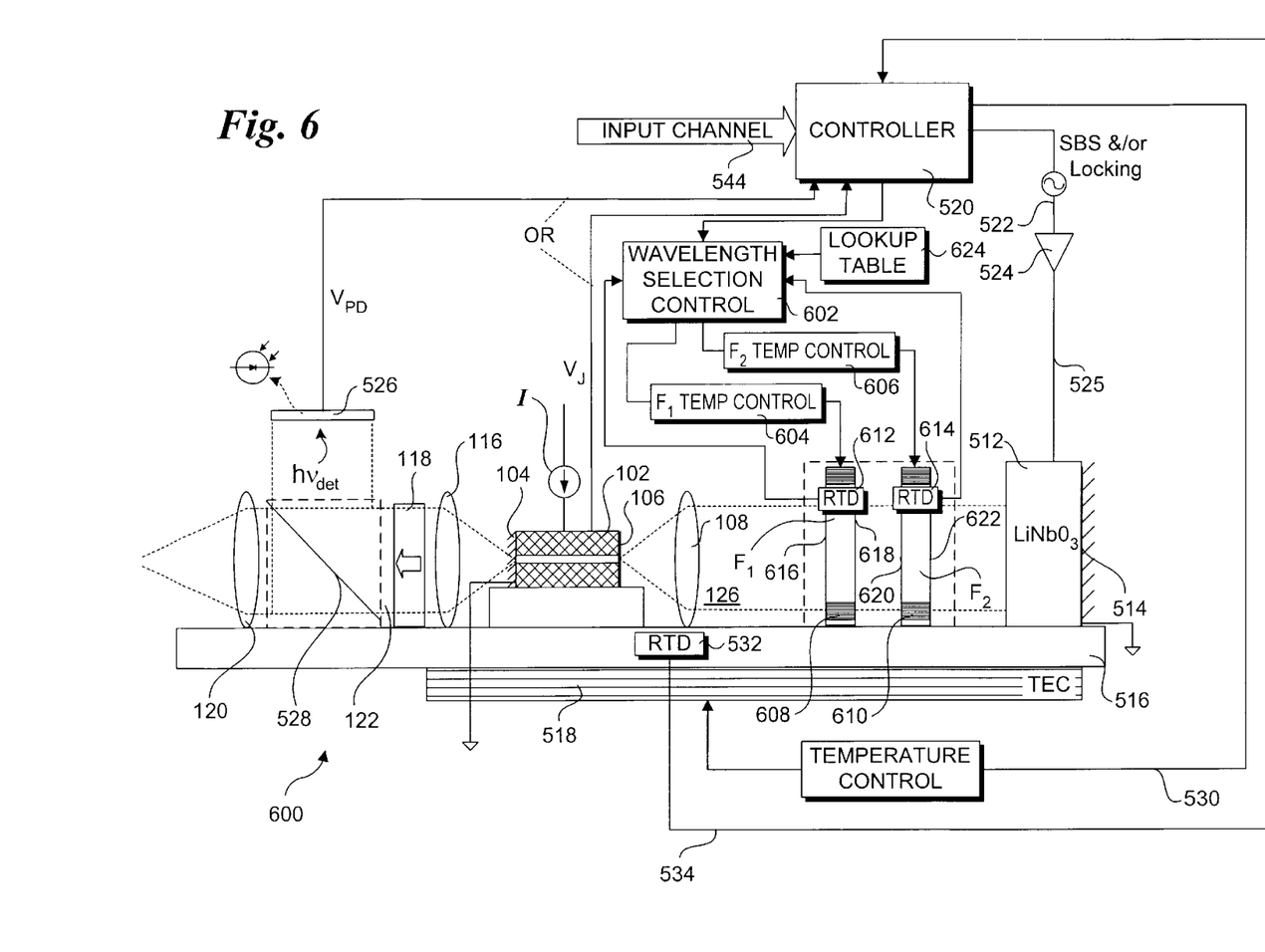
FIG. 6 is a schematic diagram showing further details of the channel selection control aspects of the ECDL of FIG. 5 in accordance with one embodiment of the invention.

For example, ECDL 600 now shows further details of a channel selection subsystem including a wavelength selection control block 602. It is noted that although the wavelength selection control block is shown external to controller 520, the control aspects of this block may be provided by the controller alone. Wavelength selection control block 602 provides electrical outputs 604 and 606 for controlling the temperatures of filters $F_1$ and $F_2$, respectively. In one embodiment, a temperature control element is disposed around the perimeter of a circular etalon, as depicted by TECs 608 and 610. Respective RTDs 612 and 614 are employed to provided a temperature feedback signal back to wavelength selection control block 602.

Generally, etalons are employed in laser cavities to provide filtering functions. They essentially function as Fabry-Perot resonators. The result of passing an optical beam through an etalon produces a set of transmission peaks (also called passbands) in the laser output. The spacing of the transmission peaks (in frequency, also known as the free spectral range) is dependent on the distance between the two faces of the etalon, e.g., faces 616 and 618 for filter $F_1$, and faces 620 and 622 for filter $F_2$. As the temperatures of the etalons change, they etalon material is caused to expand or contract, thus causing the distance between the faces to change. This effectively changes the optical path length of the etalons, which may be employed to shift the transmission peaks.

The effect of the filters is cumulative. As a result, all lasing modes except for a selected channel lasing mode can be substantially attenuated by lining up a single transmission peak of each filter. In one embodiment, the configurations of the two etalons are selected such that the respective fee spectral ranges of the etalons are slightly different. This enables transmission peaks to be aligned under a vernier tuning technique similar to that employed by a vernier scale. In one embodiment, one of the filters, known as a "grid generator," is configured to have a free spectral range corresponding to a communications channel grid, such as the ITU wavelength grid. This wavelength grid remains substantially fixed by maintaining the temperature of the corresponding grid generator etalon at a predetermined temperature. At the same time, the temperature of the other etalon, known as the channel selector, is adjusted so as to shift its transmission peaks relative to those of the grid generator. By shifting the transmission peaks of the filters in this manner, transmission peaks corresponding to channel frequencies may be aligned, thereby producing a cavity lasing mode corresponding to the selected channel frequency. In another embodiment, the transmission peaks of both the filters are shifted to select a channel.

Generally, either of these schemes may be implemented by using a channel-etalon filter temperature lookup table in which etalon temperatures for corresponding channels are stored, as depicted by lookup table 624. Typically, the etalon temperature/channel values in the lookup table may be obtained through a calibration procedure, through statistical data, or calculated based on tuning functions fit to the tuning data. In response to input channel selection 544, the corresponding etalon temperatures are retrieved from lookup table 624 and employed as target temperatures for the etalons using appropriate temperature control loops, which are well-known in the art.

In accordance with another aspect of the invention, embodiments are provided for modulating the laser cavity optical path length by modulating the distance between the cavity's reflective ends, i.e., modulating the physical length of the cavity. In this instance, the physical cavity length modulation produces a corresponding optical path length modulation, resulting in an intensity modulation in the laser output in a manner similar to the Lithium Niobate embodiment discussed above.

Figure 7:
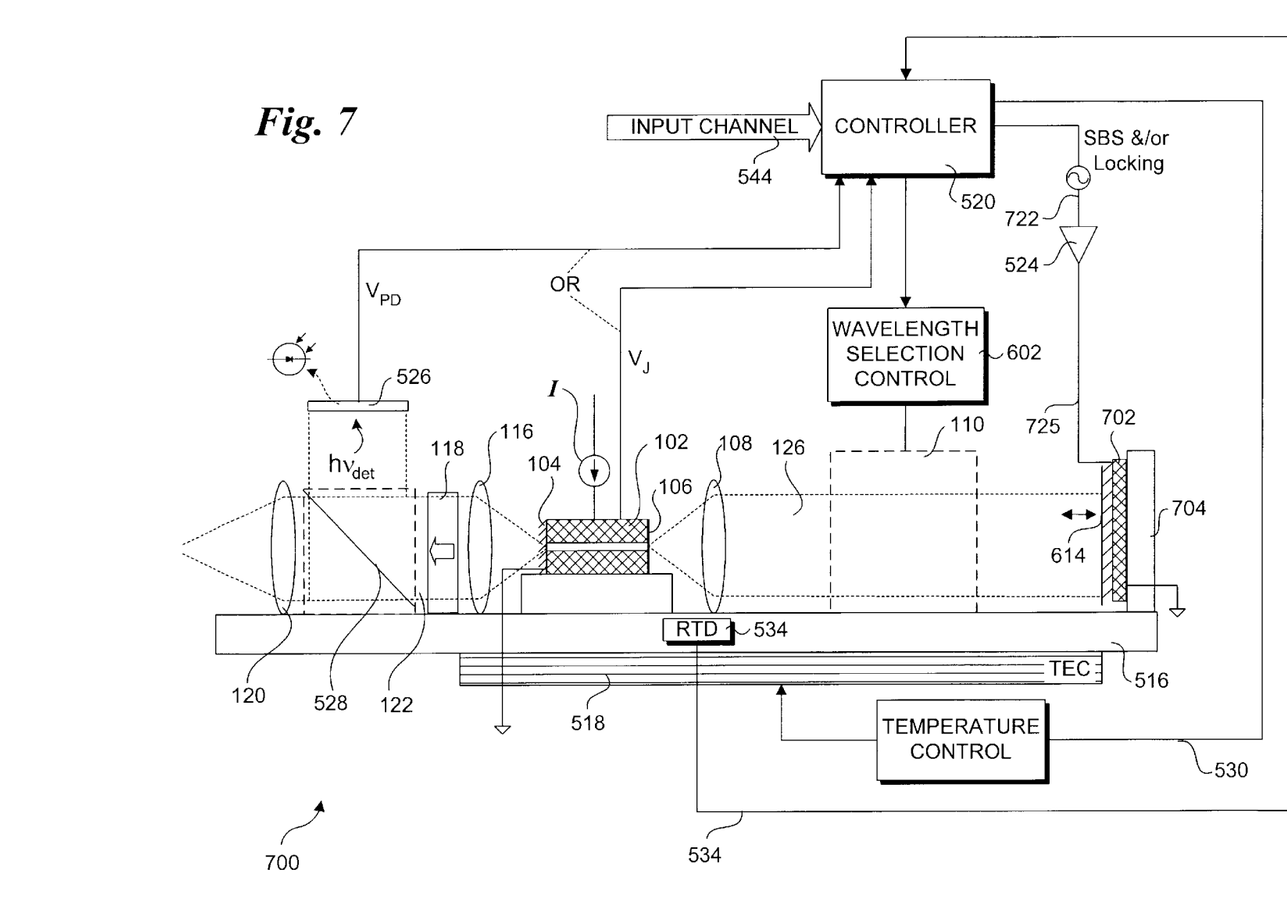
FIG. 7 is a schematic diagram of an ECDL in accordance with an embodiment of the invention in which a piezoelectric actuator is employed as an optical path length adjustment element, whereby the physical length of the laser cavity is modulated to produce a laser output with SBS suppression characteristics.

An ECDL 700 illustrative of a first embodiment for modulating the physical length of the cavity is shown in FIG. 7. This embodiment employs a piezoelectric element 702, having a backside face mounted to an upright member 704, which in turn is coupled to base 516. A reflective element (e.g. mirror) 714 is mounted to or formed on the frontside face of piezoelectric element 702. For example, reflective element may comprise a reflective coating applied to the frontside face of the piezoelectric element.

In response to a voltage differential across its faces, the piezoelectric element 702 is caused to expand and contract. If the amplitude of the voltage is modulated, the expansion and contraction of the piezoelectric element will be modulated as well, effectively modulating the thickness of the element. Since reflective element 706 is mounted to or formed on the frontside face of piezoelectric element 702, the physical cavity length is caused to modulate in response to the piezoelectric element modulation, inducing both wavelength and intensity modulations in the laser's output, as desired.

In a manner similar to that discussed above, an SBS suppression/wavelength locking signal 722 is generated by controller 520. This signal is then amplified to produce a modulated excitation signal 725 that is used to drive the modulation of the physical cavity length via piezoelectric element 702.

Figure 8:
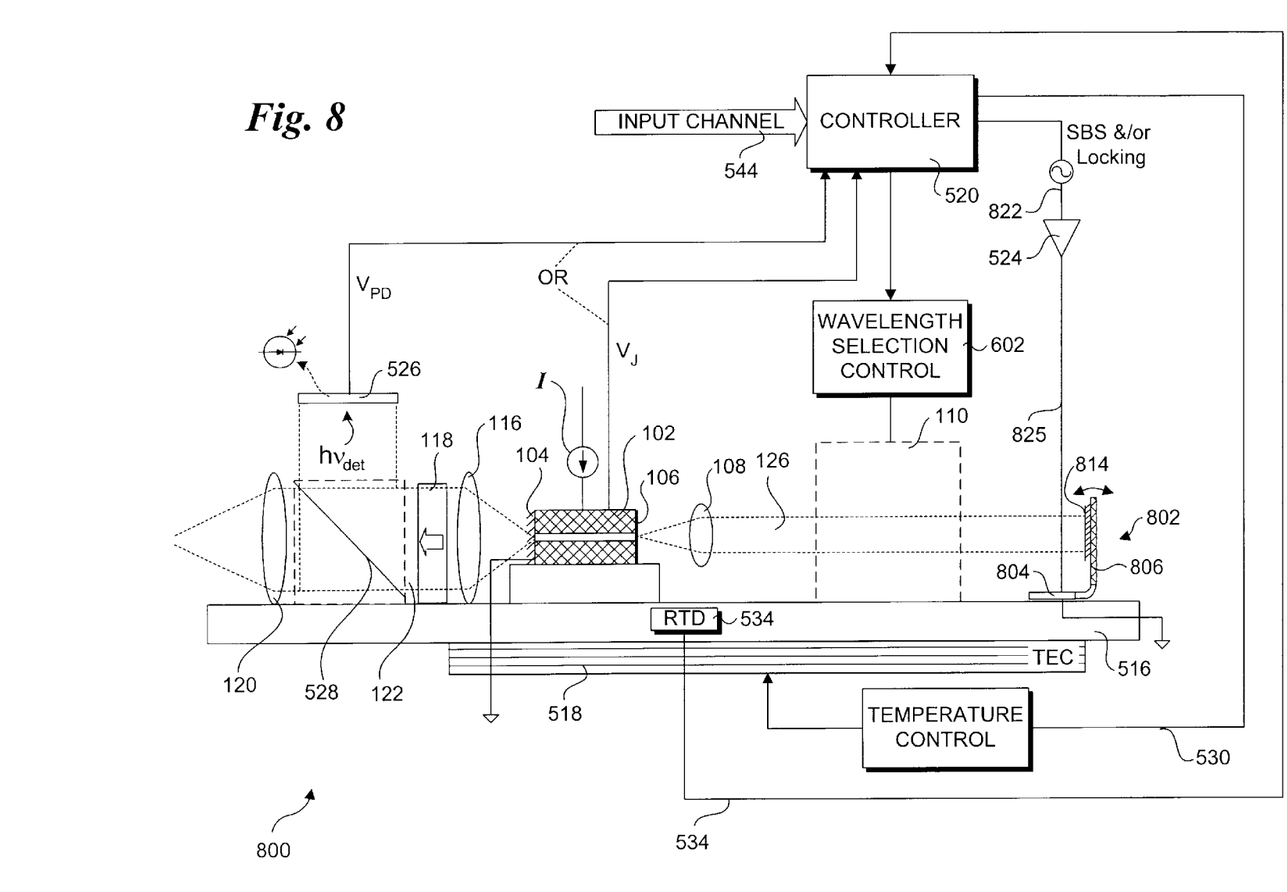
FIG. 8 is a schematic diagram of an ECDL in accordance with an embodiment of the invention in which a MEMS-actuated mirror is employed as an optical path length adjustment element, whereby the physical length of the laser cavity is modulated to produce a laser output with SBS suppression characteristics.

An ECDL 800 illustrating a second embodiment for modulating the physical cavity length is shown in FIG. 8. In this embodiment a MEMS (microelectro-mechanical systems) device 802 is employed. In the illustrated embodiment, MEMS device 802 comprises a MEMS hinge including an actuator 804 coupled to a cantilevered plate 806. A portion of the frontside face of the cantilevered plate is coated with a reflective surface 814. In one embodiment, actuator 804 comprises a pair of "comb" arrays, wherein the fixed fingers of one of the comb arrays are coupled to base 516, while the free fingers of the other comb array are coupled to cantilevered plate 806. In response to an electrical input, an electrostatic force is generated, causing the free comb fingers to move relative to the fixed fingers. As a result, the hinge is rotated, thereby shortening and lengthening the physical laser cavity length. Generally, the amount of rotation is very small, producing a length modulation in one embodiment of approximately 1 or 2 nm.

MEMS comb array actuators of the foregoing type are known in the MEMS arts. In addition to hinge-type actuators, parallel displacement actuators may be used as well, such as an electrostatically actuated parallel plate configuration employing quadrilateral flexures. When a parallel displacement actuator is employed, it will be mounted to an upright member and employed in a manner similar to piezoelectric element 702. The excitation signal 825 for driving MEMS actuator 802 is similar to that used above for the driving the piezoelectric element. It corresponds to an amplified SBS suppression wavelength locking signal 822, which is produced by controller 520 in response to an error signal generated in the following manner.

Figure 9:
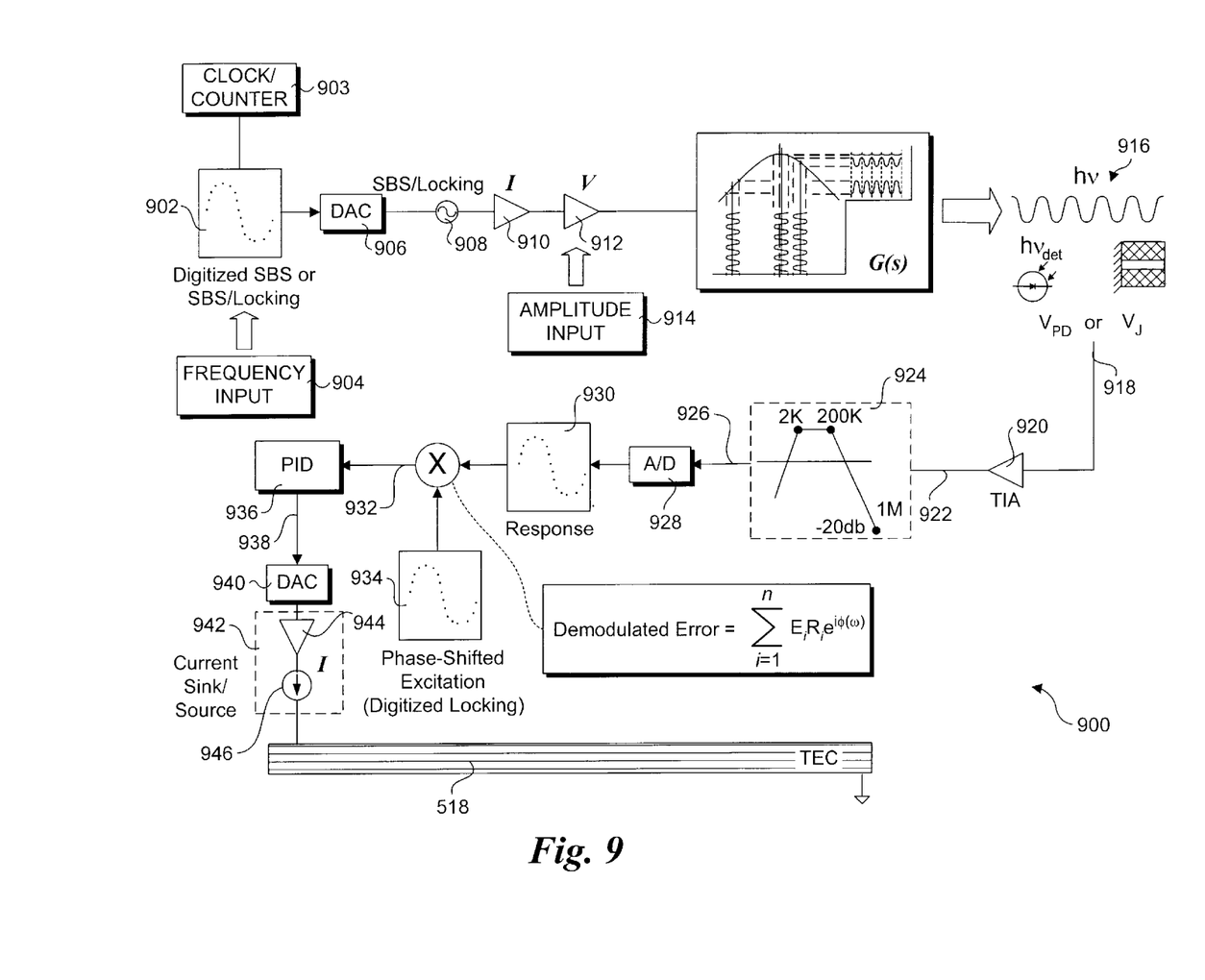
FIG. 9 is a schematic diagram of a digital servo control system for generating an excitation signal to drive an optical path length adjustment element to produce a laser output with SBS suppression characteristics and including an intensity modulation that is detected and employed as a feedback signal for wavelength locking.

A servo control block diagram 900 corresponding to control operations performed by controller 520 and related components in accordance with one embodiment of the invention is shown in FIG. 9. The servo loop employs a digital sampling scheme common to many digital control systems. In one embodiment, the sampling frequency is 100 Hz. A signal indicating the start of each sampling period is provided by a clock/counter 901. During each sampling period, respective values from a digitized excitation signal waveform 902. Generally, digitized excitation signal waveform 902 may be stored in a lookup table containing a drive signal value column and a cycle count column. Optionally, a current signal value may be generated in real-time based on an appropriate waveform function, such as $Sin(\theta)$, where $\theta$ is determined as a function of the clock count for the current cycle.

As discussed above, in one embodiment the frequency of the excitation signal may be selected via a corresponding input control, such as depicted by a frequency input block 904. Generally, the frequency input may be provided by means of an analog or digital control (e.g., an analog or digital potentiometer), or by means of a computer-based input. For example, a software program running on a host computer may provide a user-interface to enable a user to select a frequency of the excitation signal. Corresponding information could then be communication to controller 520. In one embodiment, respective lookup tables are provided for various frequencies or ranges of frequency. In the real-time sinusoid calculation, the update frequency or granularity of the calculation may be adjusted based on the selected frequency.

In one embodiment, appropriate waveform values are retrieved from lookup table 902 and provided as an input to a digital-to-analog converter (DAC) 906 When a digitized waveform is fed into a DAC at a fixed rate (i.e., sampling frequency), the DAC will output a smoothed analog waveform corresponding to the input digital waveform. This analog waveforms is depicted as modulation signal 908.

Next, the modulation signal is fed into an amplifier to amplify both the drive current and voltage amplitude of the signal, thereby producing an appropriate excitation signal that is used to drive the cavity optical path length modulator. This amplification is depicted by respective current and voltage amplifiers 910 and 912. In addition to frequency control, means may be provided for selecting and/or adjusting the line width of the laser output, which is dependent on the frequency excursion caused by the cavity optical path length modulation amplitude. In one embodiment, a control input similar to that described above for frequency input 904 is employed, as depicted by an amplitude input block 914.

The amplified modulated excitation signal is supplied to one of the optical path length adjustment elements discussed above to cause a modulation in the laser cavity optical path length, resulting in a modulation in the wavelength and intensity of the output of the laser. This corresponds to a transfer function G(s) of the laser, with the resulting wavelength and intensity modulations shown at 916. In the event that the cavity optical path length modulation is only used for SBS suppression, the operation of the laser is complete. Otherwise, if the cavity optical path length modulation is used for SBS suppression and wavelength locking, a feedback signal is next generated in the following manner.

In response to a detected intensity modulation in the laser output, a corresponding intensity modulation feedback signal 818 is generated. As described above, this feedback signal may comprise a signal derived from direct measurement of the intensity modulation using a photo-electric sensor or the like (as depicted by $V_{PD}$), or may be obtained by measuring the laser diode junction voltage $V_J$, which is indicative of the intensity modulation. The intensity modulation feedback signal is then amplified by a transimpedance amplifier (TIA) 820, producing an amplified intensity modulation feedback signal 822.

At this point, the amplified intensity modulation feedback signal may be passed through an optional band-pass filter 924. In general, the band-pass filter should be configured to enable signal components having frequencies corresponding to the modulation frequency range to pass through, while substantially attenuating other signal components at or below these frequencies. For illustrative purposes, band-pass filter 924 is shown to have a band-pass in the range from 2–200 KHz, corresponding to an expected modulation frequency range of 5–100 KHz. In another embodiment, a low-pass filter is employed instead of a band-pass filter. In this instance, the cut-off frequency of the low-pass filter should be selected based on the maximum anticipated modulation frequency to be employed. In yet another embodiment, the band-pass or low-pass filter is tunable, enabling the filter characteristics to be tuned in accordance with the modulation frequency currently employed.

Thus, after passing through bandpass filter 924, a filtered feedback signal 926 is produced. This feedback signal is then fed into an analog-to-digital converter (A/D) 928, which converts the signal into a digital pulse train, illustrated by a digitized response waveform 930. This waveform is illustrative of the modulation intensity produced in response to the excitation signal, as discussed above with reference to FIG. 4.

Next, a demodulated error signal 832 is produced. As discussed above, the demodulated error signal can be derived by the dot product of the response waveform times the excitation waveform in accordance with the summation formula of equation 2. This will generally be a function of the phase shift angle φ between the excitation signal input and the resulting response signal output. It is advantageous to eliminate this phase shift angle, as it may lead to inconsistent error signals. In one embodiment, this is performed by digitally shifting the excitation by an amount substantially equal to the phase shift, as depicted by phase-shifted excitation signal 834. Generally, the amount of phase shift, which represents a time delay, can be numerically calculated or empirically derived (most common). In general, the primary components of the phase shift are due to time delays caused by the various amplifiers, filters, and electromechanical elements employed to induce the intensity modulation and process the corresponding feedback signal.

The demodulated error signal is then provided as an input to a PID (proportional, integral and derivative) control block 936, which is well known in the control system art. The PID block outputs a digital temperature command signal 938, which is converted into an analog form by DAC 940. The analog signal is then fed into a current control block 942, depicted by an amplifier 944 and a current sink/source 946. This current sink/source is used to control the direction of the current passing through TEC 518. In accordance with Peltier device principles, if a current is driven one way, the device functions as a heating element, while reversing the current causes the device to act as a cooling element. Thus TEC 518 can be used to adjust the temperature of base 516 very rapidly.

In addition to providing fine-tuning of the (substantially) continuous optical path length of the laser cavity by adjusting the temperature of the laser's base, other techniques that produce similar results may be employed. For example, in one embodiment the temperature of the gain medium is controlled, as described in co-pending application Ser. No. 10/335,775, entitled "LASER FACET PHASE CONTROL," filed concurrently herewith. Other techniques to control the path length of the laser cavity can be employed, such as use of a piezo-electric actuator or MEMS mirror that apply the dither such as shown in FIGS. 7 and 8, or via a control current to the laser diode such as via a tuning or phase control section. For example, the gain medium chip may include a phase control section with two regions where current is injected—one controls the gain as usual, but the other passes through a similar section where the material has been changed so that no gain is produced but just the index is changed—hence producing a corresponding change in the optical path length of the cavity.

In one embodiment, the various ECDL configurations described herein may be manufactured using a hybrid process, combining semiconductor-type processing techniques for forming applicable elements on a substrate, and then attaching other components to the substrate during subsequent operations. For example, in one embodiment, base 516 comprises an aluminum nitride substrate. The laser gain chip element 102 and its submount are mounted onto this substrate, as are the other elements of the ECDL. The mounting techniques generally include soldering, laser welding, and epoxy attachments.

It is noted that although the foregoing embodiment provide concurrent wavelength locking and SBS suppression, this is not required during laser operation. For example, under some circumstances it may be desired to disable SBS suppression. This can be accomplished by simply lowering the modulation frequency and/or amplitude of the excitation signal.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for suppressing stimulated Brillouin scattering (SBS) in an fiber link, comprising:
   determining SBS suppression characteristics of an optical signal that may be transmitted via the fiber link with a reduced level of stimulated Brillouin scattering, said SBS suppression characteristics including a modulation frequency and line width and raising an SBS threshold of the fiber link; and
   generating an optical signal comprising an external cavity laser output having a modulation frequency and line width corresponding to the SBS suppression characteristics by inducing a laser cavity optical path length modulation in the external cavity laser at the modulation frequency and having a modulation amplitude causing a frequency excursion in the laser output corresponding to the line width.

2. The method of claim 1, wherein the laser cavity optical path length modulation is induced by driving an optical path length adjustment element disposed in or defining an end of a laser cavity of the external cavity laser with an excitation signal having a frequency corresponding to the modulation frequency and having a voltage amplitude that produces a modulation amplitude in the laser cavity optical path length corresponding to the frequency excursion in the laser output.

3. The method of claim 2, wherein the optical path length adjustment element comprises an optical element that changes it optical path length in response to the excitation signal.

4. The method of claim 3, wherein the optical path length adjustment element comprises an optical element that is made of a material that changes its index of refraction in response to an electrical input.

5. The method of claim 2, wherein the optical path length adjustment element comprises an element to which a reflector is operatively coupled, said modulation of said optical path length adjustment element causing a modulation in the physical cavity length of the external cavity laser.

6. The method of claim 5, wherein the optical path length adjustment element comprises a piezo-electric actuator.

7. The method of claim 5, wherein the optical path length adjustment element comprises a Micro-Electro-Mechanical Systems (MEMS) actuator.

8. The method of claim 1, wherein modulation of the cavity optical path length induces an intensity modulation in the laser output, the method further comprising:
 detecting the intensity modulation of the laser output to produce an intensity modulation feedback signal;
 deriving an error signal as a function of the intensity modulation feedback signal; and
 employing the error signal to tune the external cavity laser.

9. The method of claim 8, wherein the optical path length modulation is induced in response to an excitation signal and wherein the intensity modulation feedback signal comprises a response signal and the error signal is derived as a function of a dot product of the excitation signal and the response signal.

10. The method of claim 9, wherein the laser is tuned by adjusting the physical length of the laser cavity.

11. The method of claim 8, wherein the intensity modulation of the laser output are detected using a photo-electric sensor.

12. The method of claim 8, wherein the intensity modulation of the laser output is detected by monitoring a change in an electrical characteristic of a gain medium employed by the laser.

13. A laser comprising:
 a base;
 a gain medium operatively coupled to the base, having front and rear facets, to produce an optical emission in response to an electrical input;
 a reflective element, operatively coupled to the base, to form a laser cavity having endpoints defined by the front facet of the gain medium and a face of the reflective element;
 an optical path length adjustment element operatively coupled to the base; and
 a controller to provide an excitation input to the optical path length adjustment element to induce a modulation of an optical path length of the laser cavity to produce a laser output having a line width and modulation frequency for suppressing stimulated Brillouin scattering in a fiber link to which the laser output may be launched into.

14. The laser of claim 13, wherein the modulation of the optical path length of the laser cavity produces an intensity modulation in the laser output, further comprising:
 a detector, to produce a feedback signal corresponding to the intensity modulation in the laser output; and
 a servo mechanism operatively coupled to or provided by the controller, to generate a tuning signal to adjust a center frequency of the laser output in response to the feedback signal.

15. The apparatus of claim 14, further comprising at least one thermoelectric element, thermally coupled to the base, which is driven by a temperature control signal output by the servo mechanism to adjust the temperature of the base.

16. The apparatus of claim 14, wherein the feedback signal comprises a response signal and the excitation input comprises an excitation signal, and wherein the servo mechanism generates the tuning signal based on an error signal derived from a dot product of the excitation and response signals.

17. The laser of claim 14, wherein the detector comprises a photo-electric sensor, and the laser further includes a beam splitter disposed in an optical path of the output of the laser to split off a portion of the output such that the split-off portion is received by the photo-electric sensor.

18. The laser of claim 14, wherein the gain medium comprises a diode laser, and the detector comprises a voltage detector that detects a voltage difference across a diode junction of the laser diode.

19. The laser of claim 13, wherein the optical path length adjustment element comprises an optical element disposed in the laser cavity made of a material that changes its index of refraction in response to an electrical input.

20. The laser of claim 19, wherein the material comprises Lithium Niobate.

21. The laser of claim 19, wherein the reflective element is coupled to a rear face of the optical path length adjustment element.

22. The laser of claim 13, wherein the optical path length adjustment element comprises a piezo-electric actuator operatively coupled to the reflective element.

23. The laser of claim 13, wherein the optical path length adjustment element comprises a Micro-Electro-Mechanical Systems (MEMS) actuator coupled to the reflective element.

24. The laser of claim 13, further comprising an input control operatively coupled to the controller via which the modulation frequency of the laser output may be selected and/or adjusted.

25. The laser of claim 13, further comprising an input control operatively coupled to the controller via which the line width of the laser output may be selected and/or adjusted.

26. A laser comprising:
 a gain medium to generate an optical emission;
 first and second reflective elements, to define a laser cavity;
 first means for adjusting an optical path length of the laser cavity; and
 controller means to provide an excitation single to the first means for adjusting the optical path length to induce a modulation of the optical path length of the laser cavity to produce a laser output having a line width and modulation frequency for suppressing stimulated Brillouin scattering in a fiber link to which the laser output may be launched into.

27. The laser of claim 26, wherein the modulation of the optical path length produces in intensity modulation in the laser output, further comprising:

detector means, to produce a feedback signal corresponding to the intensity modulation in the laser output; and servo means, operatively coupled to or provided by the controller means, to generate a tuning signal to adjust a center frequency of the laser output in response to the feedback signal.

28. The laser of claim 27, further comprising second means for adjusting the optical path length of the laser cavity, said second means employed for fine tuning an output frequency of the laser output in response to the tuning signal.

29. The laser of claim 26, further comprising control input means for adjusting and/or selecting the modulation frequency of the laser output.

30. The laser of claim 26, further comprising control input means for adjusting and/or selecting the line width of the laser output.

* * * * *